United States Patent
Hirayama et al.

(10) Patent No.: US 7,675,069 B2
(45) Date of Patent: Mar. 9, 2010

(54) INALGAN EMITTING LIGHT IN ULTRAVIOLET SHORT-WAVELENGTH REGION AND PROCESS FOR PREPARING THE SAME AS WELL AS ULTRAVIOLET LIGHT-EMITTING DEVICE USING THE SAME

(75) Inventors: Hideki Hirayama, Saitama (JP); Yoshinobu Aoyagi, Saitama (JP)

(73) Assignee: Riken, Wako-Shi, Saitama (JP)

( * ) Notice: Subject to any disclaimer, the term of this patent is extended or adjusted under 35 U.S.C. 154(b) by 0 days.

(21) Appl. No.: 09/790,660

(22) Filed: Feb. 23, 2001

(65) Prior Publication Data
US 2001/0028064 A1    Oct. 11, 2001

(30) Foreign Application Priority Data
Feb. 23, 2000    (JP) .............................. 2000-045318

(51) Int. Cl.
*H01L 21/00*    (2006.01)
(52) U.S. Cl. .............................. 257/79; 257/94; 257/96; 257/97; 257/85; 257/E33.001; 438/22; 438/46; 438/47; 438/29; 438/35
(58) Field of Classification Search .................... 257/79, 257/94, 103, 190, 15, 18, 22, 97, E33.001; 257/96, 85; 438/22, 46, 47, 29, 35
See application file for complete search history.

(56) References Cited
U.S. PATENT DOCUMENTS

| | | | | |
|---|---|---|---|---|
| 4,809,287 A | * | 2/1989 | Ohba et al. | ................... 372/45 |
| 5,828,684 A | * | 10/1998 | Van de Walle | ................. 372/45 |
| 6,020,602 A | | 2/2000 | Sugawara et al. | |
| 6,288,416 B1 | * | 9/2001 | Koike et al. | .................... 257/94 |
| 6,359,292 B1 | * | 3/2002 | Sugawara et al. | ........... 257/103 |
| 6,521,917 B1 | * | 2/2003 | Takayama et al. | ........... 257/103 |

FOREIGN PATENT DOCUMENTS

| | | |
|---|---|---|
| EP | 0 742 622 A3 | 11/1996 |
| JP | 02-229475 | 9/1990 |
| JP | 03-252177 | 11/1991 |
| JP | 04-163969 | 6/1992 |
| JP | 04-223330 | 8/1992 |
| JP | 04-242985 | 8/1992 |

(Continued)

OTHER PUBLICATIONS

Double-Heterostructure Blue-Light-Emitting Diodes, Jpn. J. Appl. Phys. 32(1993), pp. L8-L11, Part 2, No. 1A/B, Jan. 15, 1993.

(Continued)

*Primary Examiner*—Lynne A. Gurley
*Assistant Examiner*—Jhunghwa M Im
(74) *Attorney, Agent, or Firm*—Birch, Stewart, Kolasch & Birch, LLP (57) ABSTRACT

For the purpose of emitting light in an ultraviolet short-wavelength region having a wavelength of 360 nm or shorter, it is arranged in InAlGaN in such that a ratio of composition of In is 2% to 20%, a ratio of composition of Al is 10% to 90%, and a total of ratios of composition in In, Al, and Ga is 100%.

4 Claims, 7 Drawing Sheets

FOREIGN PATENT DOCUMENTS

| | | |
|---|---|---|
| JP | 05-029653 | 2/1993 |
| JP | 05-243614 | 9/1993 |
| JP | 06-021511 | 1/1994 |
| JP | 6-164055 A | 6/1994 |
| JP | 9-153645 A | 6/1997 |
| JP | 10-242513 | 9/1998 |
| JP | 10-321962 | 12/1998 |
| JP | 11-340580 A | 12/1999 |
| KR | 1998-087225 | 12/1998 |
| WO | WO97/13303 | 4/1997 |

OTHER PUBLICATIONS

Aumer et al., Applied Physics Letters., vol. 75 No. 21, pp. 3315-3317, (Nov. 1999).

* cited by examiner

GROWTH TEMPERATURE RANGE IN METALORGANIC
VAPOR PHASE EPITAXY OF NITRIDE SEMICONDUCTOR

INALGAN EMITTING LIGHT IN ULTRAVIOLET SHORT-WAVELENGTH REGION AND PROCESS FOR PREPARING THE SAME AS WELL AS ULTRAVIOLET LIGHT-EMITTING DEVICE USING THE SAME

BACKGROUND OF THE INVENTION

1. Field of the Invention

The present invention relates to InAlGaN (indium aluminum gallium nitride) emitting light in an ultraviolet short-wavelength region, and a process for preparing the same as well as to an ultraviolet light-emitting device using the InAlGaN emitting light in an ultraviolet short-wavelength region, and more particularly to InAlGaN emitting light in an ultraviolet short-wavelength region at room temperature with high efficiency, and a process for preparing the same as well as to an ultraviolet light-emitting device using the InAlGaN emitting light in an ultraviolet short-wavelength region at room temperature with high efficiency.

2. Description of the Related Art

Nitride semiconductors such as GaN (gallium nitride), InGaN (indium gallium nitride), and AlGaN (aluminum gallium nitride) which have been heretofore utilized as an ultraviolet light-emitting device for emitting light in an ultraviolet short-wavelength region having a wavelength of 360 nm or shorter. However, highly efficient light emission cannot be attained by such nitride semiconductors at room temperature in an ultraviolet short-wavelength having a wavelength of 360 nm or less. Accordingly, it has been concluded that an ultraviolet light-emitting device, which can emit light in an ultraviolet short-wavelength region cannot be realized by the use of such nitride semiconductors as described above.

Namely, a wavelength of up to 370 nm can be merely realized with respect to light-emitting diode as a light-emitting device wherein a nitride semiconductor is used in a short-wavelength, while only a wavelength of up to 390 nm can be realized with respect to laser diode until now.

Thus, there has been a strong need for developments as to InAlGaN exhibiting highly efficient light emission at room temperature in an ultraviolet short-wavelength region of a wavelength of 360 nm or shorter, and a process for preparing the same as well as an ultraviolet light-emitting device wherein the InAlGaN emitting light in an ultraviolet short-wavelength region is employed.

OBJECTS AND SUMMARY OF THE INVENTION

The present invention has been made in view of the needs which have been heretofore demanded strongly as described above, and an object of the invention is to provide InAlGaN exhibiting highly efficient light emission at room temperature in an ultraviolet short-wavelength region of a wavelength of 360 nm or shorter, and a process for preparing the same as well as an ultraviolet light-emitting device wherein the InAlGaN emitting light at room temperature with high efficiency in an ultraviolet short-wavelength region is used.

In order to achieve the above-described object, InAlGaN according to the invention comprises a ratio of composition of In being 2% to 20%, a ratio of composition of Al being 10% to 90%, and a total of ratios of composition of In, Al, and Ga being 100%.

Furthermore, a ratio of composition of the In may be 6% or more in the above described InAlGaN.

Moreover, a process for preparing InAlGaN according to the present invention comprises the InAlGaN being subjected to crystal growth at a growth temperature of 830° C. to 950° C. in accordance with metalorganic vapor phase epitaxy wherein ammonia, trimethylgallium, a trimethylindium adduct, and trimethylaluminum are used as material gases.

Furthermore, a flow rate of the ammonia is 2 L/min, a flow rate of the trimethylgallium is 2 μmol/min to 5 μmol/min, a flow rate of the trimethylindium adduct is 5 μmol/min to 60 μmol/min, and a flow rate of the trimethylaluminum is 0.5 μmol/min to 10 μmol/min in the above described process for preparing InAlGaN according to the invention.

Moreover, an ultraviolet light-emitting device using the InAlGaN according to the invention comprises a first InAlGaN layer wherein a ratio of composition of In is 2% to 20%, a ratio of composition of Al is 10% to 90%, and a total of ratios of composition in In, Al, and Ga is 100%, and a second InAlGaN layer ratios of composition of which differ from that of the first layer wherein a ratio of composition of In is 2% to 20%, a ratio of composition of Al is 10% to 90%, and a total of ratios of composition in In, Al, and Ga is 100%; and the InAlGaN involves a quantum well structure formed by laminating alternately a plurality of layers of the first InAlGaN layer, and the second InAlGaN layer.

Furthermore, a ratio of composition of the In in the first InAlGaN layer is 6% or more in the above described ultraviolet light-emitting device using the InAlGaN according to the present invention.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

DETAILED DESCRIPTION OF THE PREFERRED EMBODIMENTS

In the following, an example of embodiments of InAlGaN emitting light in an ultraviolet short-wavelength region according to the present invention, and a process for preparing the same as well as of an ultraviolet light-emitting device wherein the InAlGaN emitting light in an ultraviolet short-wavelength region is used will be described in detail.

Figure 1:
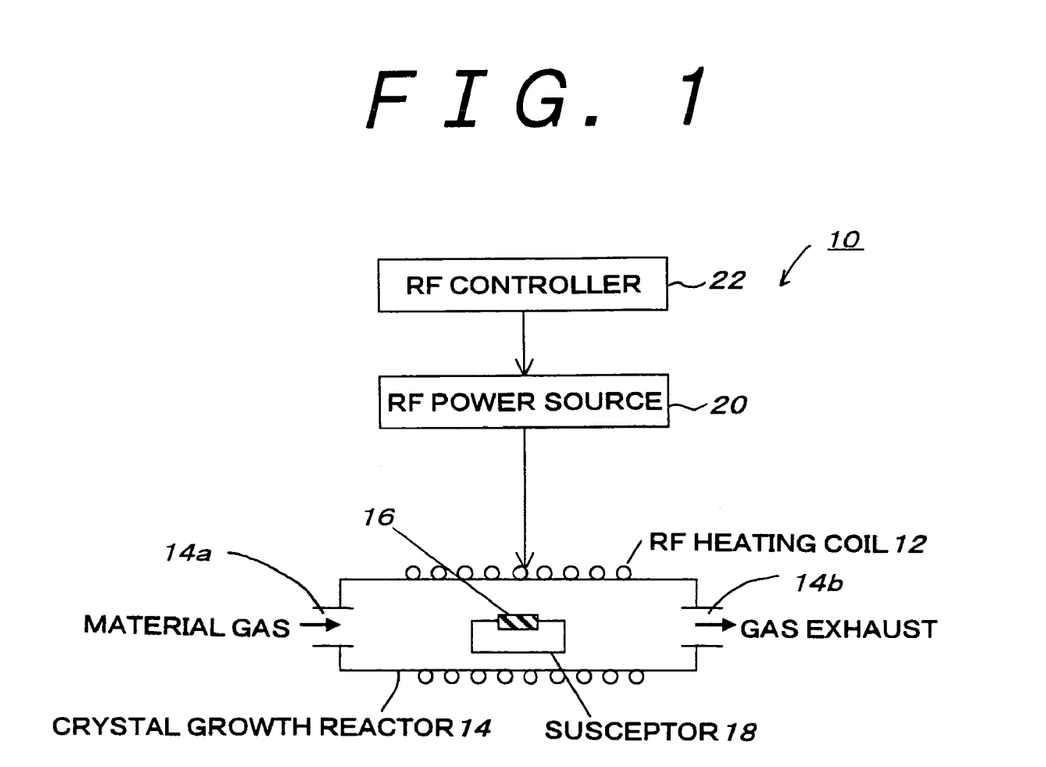
FIG. 1 is an explanatory diagram illustrating a conceptual construction of crystal growth equipment for producing InAlGaN emitting light in an ultraviolet short-wavelength region according to the present invention on a substrate such as a semiconductor wafer as a crystal thin film in accordance with metalorganic vapor phase epitaxy.

InAlGaN emitting light in an ultraviolet short-wavelength region according to the present invention (hereinafter referred optionally to as "ultraviolet light-emitting InAlGaN") may be prepared on a substrate as a semiconductor wafer as a crystal thin film by crystal growth equipment in accordance with, for example, metalorganic vapor phase epitaxy. In FIG. 1, an example of such crystal growth equipment is illustrated.

Namely, FIG. 1 is an explanatory diagram illustrating a conceptual construction of crystal growth equipment for preparing ultraviolet light-emitting InAlGaN wherein the crystal growth equipment 10 is provided with a crystal growth reactor 14 around which is surrounded by an RF heating coil 12 wherein a susceptor 18 on the upper surface of which is placed a semiconductor wafer 16 as a substrate for growing the ultraviolet light-emitting InAlGaN, and the susceptor that functions to heat the semiconductor wafer 16.

Furthermore, an RF power source 20 is connected to the RF heating coil 12, and in addition, an RF controller 22 composed of a microcomputer is connected to the RF power source.

The RF controller 22 controls an output of the RF power source 20. Namely, power supply from the RF power source 20 to the RF heating coil 12 is controlled by the RF controller 22, and the susceptor 18 is heated by the RF heating coil 12 in response to the power supply from the RF power supply source 20.

More specifically, the susceptor 18 is heated by eddy-current induction heating due to power supply from the RF power source 20 to the RF heating coil 12 in the crystal growth equipment 10.

The susceptor 18 is made of, for example, carbon and the like.

On one hand, on the crystal growth reactor 14 are defined a gas introducing hole 14a for introducing a variety of gases such as material gases of materials of ultraviolet light-emitting InAlGaN to be formed on the semiconductor wafer 16 and carrier gases as well as a gas exhausting hole 14b for exhausting a variety of gases which have been introduced in the crystal growth reactor 14.

In the construction as described above, material gases of materials required for forming a crystal thin film of ultraviolet light-emitting InAlGaN are introduced in the crystal growth reactor 14, which has been depressurized to 76 Torr, together with carrier gases through the gas introducing hole 14a in order to form the crystal thin film of the ultraviolet light-emitting InAlGaN on the semiconductor wafer 16 placed on the susceptor 18.

In this case, the susceptor 18 has been heated by the RF heating coil 12 in response to power supply from the RF power source 20 that is controlled by the RF controller 22 based on a monitor of a thermocouple (not shown), which had been embedded in the susceptor 18, so that the semiconductor wafer 16 is also heated by means of heat conduction derived from the susceptor 18 heated at a growth temperature optimum for forming the crystal thin film of the ultraviolet light-emitting InAlGaN in accordance with crystal growth.

Thus, the material gases introduced in the crystal growth reactor 14 are decomposed and reacted by heat, whereby the crystal thin film of the ultraviolet light-emitting InAlGaN is formed on the semiconductor wafer 16 in accordance with crystal growth.

In this case, the material gases required for forming a crystal thin film of ultraviolet light-emitting InAlGaN are ammonia, trimethylgallium, a trimethylindium adduct, and trimethylaluminum. Furthermore, the carrier gases are hydrogen and nitrogen.

A flow rate of these material gases is, for example, 2 L/min in case of ammonia, 2 µmol/min to 5 µmol/min in case of trimethylgallium, 5 µmol/min to 60 µmol/min in case of trimethylindium adduct, and 0.5 µmol/min to 10 µmol/min in case of trimethylaluminum, respectively.

On one hand, a flow rate of the carrier gases is 100 cc/min in case of hydrogen, and 2 L/min in case of nitrogen, respectively.

Since a growth temperature of crystal growth of ultraviolet light-emitting InAlGaN is 830° C. to 950° C., the semiconductor wafer 16 is set in such that it is heated at a temperature of 830° C. to 950° C.

Furthermore, a growth rate of the crystal thin film of ultraviolet light-emitting InAlGaN is set at 120 nm/hour.

Figure 2:
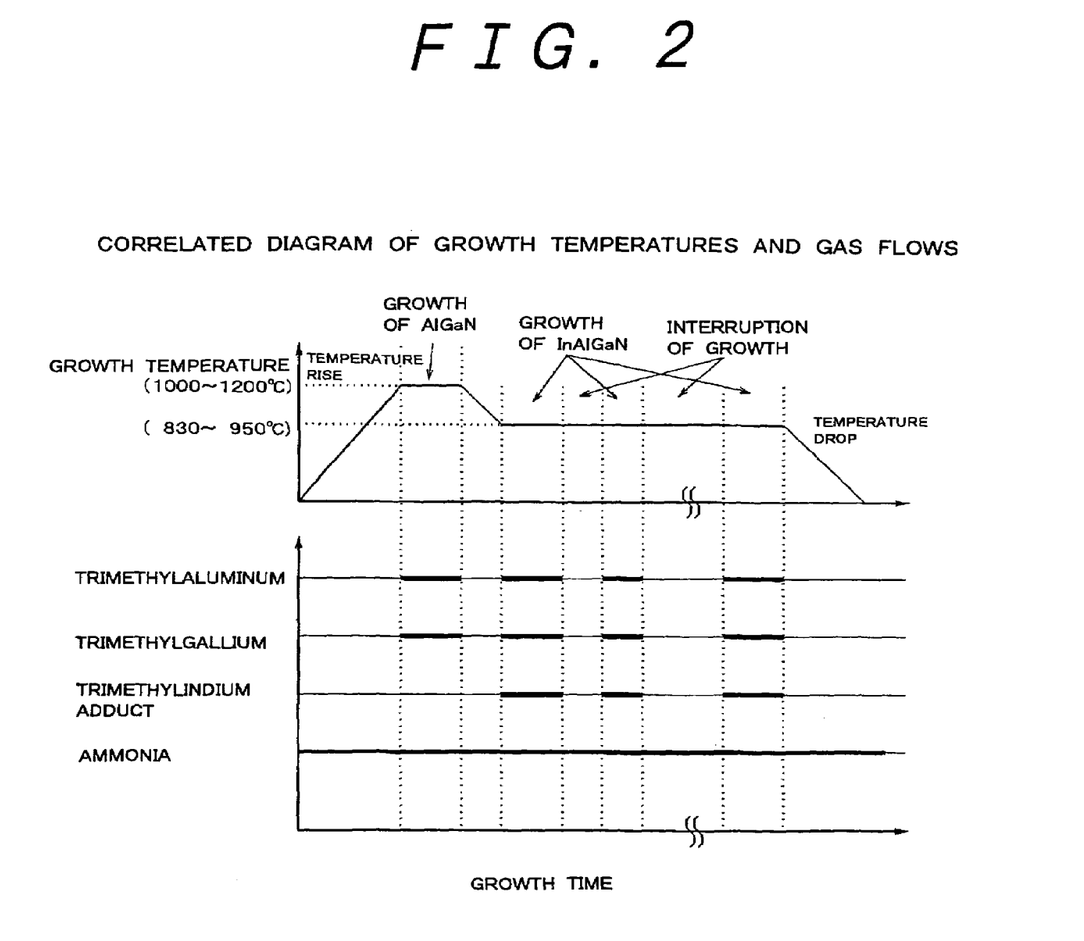
FIG. 2 is a correlated diagram of growth temperatures and gas flows.

FIG. 2 is a correlated diagram of growth temperatures and gas flows. The material gases are fed into the crystal growth reactor 14 at timings and growth temperatures as shown in FIG. 2.

Figure 3:
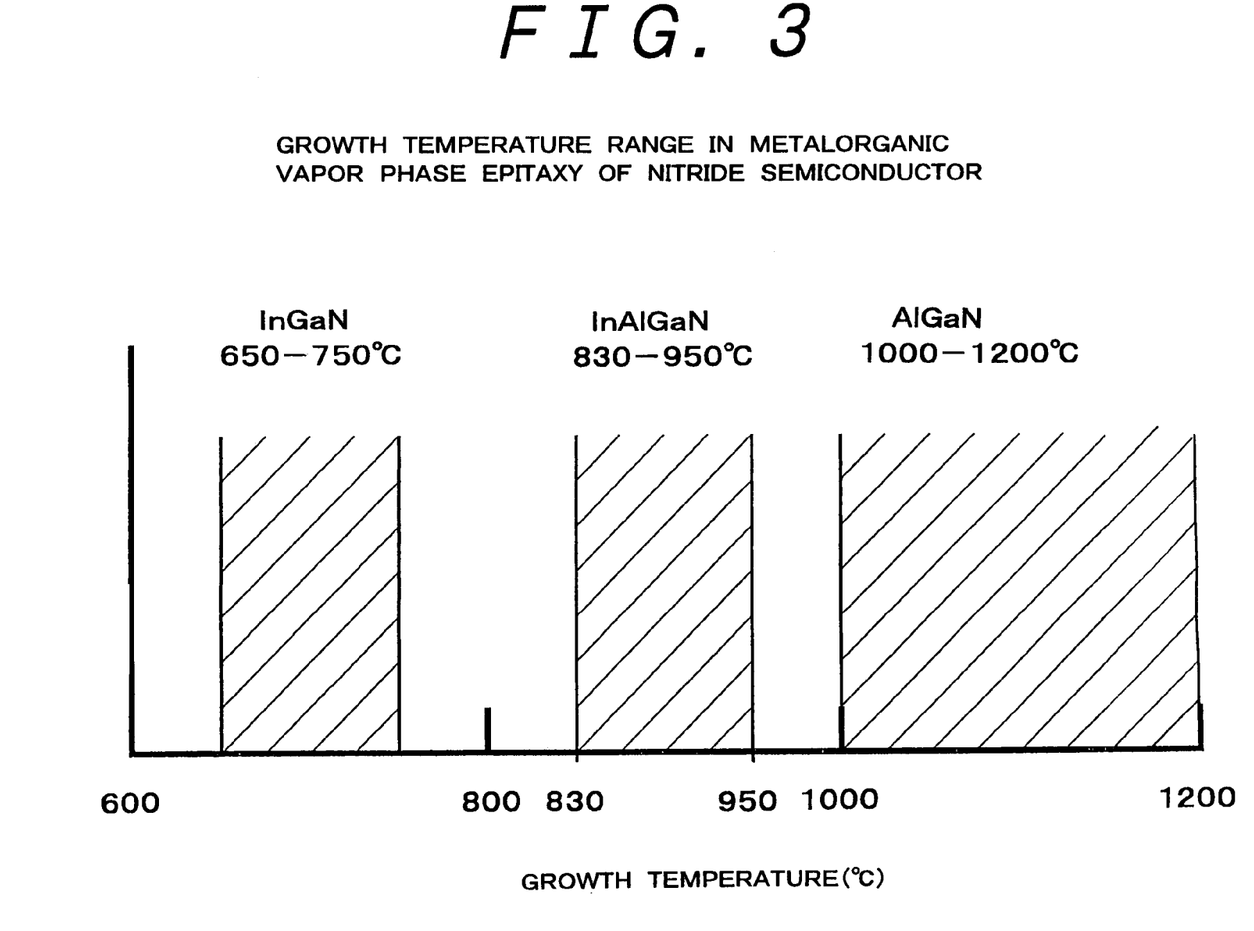
FIG. 3 is an explanatory diagram showing a range of growth temperature in vapor phase deposition of a nitride semiconductor.

Meanwhile, a growth temperature in crystal growth of InGaN is within a range of from 650° C. to 750° C. as shown in FIG. 3, while a growth temperature in crystal growth of AlGaN is within a range of from 1000° C. to 1200° C. as shown in FIGS. 2 and 3. In this respect, InGaN differs remarkably from AlGaN in their growth temperatures in crystal growth. Therefore, it has been heretofore considered that preparation of high quality crystal of InAlGaN is impossible.

According to experiments by the present inventor, however, results of the experiments have exhibited that crystal growth of high quality InAlGaN proceeds at a temperature of 830° C. to 950° C. being an intermediate temperature defined between the growth temperature in crystal growth of InGaN and the growth temperature in crystal growth of AlGaN, whereby ultraviolet light-emitting InAlGaN can be obtained as shown in FIGS. 2 and 3.

In a ratio of composition of the resulting ultraviolet light-emitting InAlGaN thus obtained, In is 2% to 20%, and Al is 10% to 90% (It is to be noted that total in ratios of composition of In, Al, and Ga is 100%). In this case, it is preferred that a ratio of composition of In is 6% or higher.

In vapor phase deposition of the above described ultraviolet light-emitting InAlGaN, a content of In in a crystal increases inductively by introduction of Al as mentioned hereinafter by referring to FIGS. 4 through 6.

As a result of introduction of several % of In into AlGaN, ultraviolet light-emitting intensity is remarkably enhanced.

Namely, ultraviolet light-emitting InAlGaN is possible to emit light at room temperature with high efficiency in a short-wavelength region in a deep ultraviolet region of a wavelength of 280 nm to 360 nm. Accordingly, when such ultraviolet light-emitting InAlGaN as described above is used, an ultraviolet light-emitting device emitting light in a wavelength region of a wavelength of 280 nm to 360 nm can be prepared.

In the following, experimental results of ultraviolet light-emitting InAlGaN at room temperature will be described by referring to FIGS. 4 through 6 wherein the ultraviolet light-emitting InAlGaN was prepared at 830° C. growth temperature and at 120 nm/hour growth rate in the case where a flow rate of ammonia is 2 L/min, that of trimethylgallium is 3 µmol/min, that of a trimethylindium adduct is 60 µmol/min, and that of trimethylaluminum is 0.5 µmol/min with respect to material gases, besides a flow rate of hydrogen is 100 cc/min, and that of nitrogen is 2 L/min with respect to carrier gases.

Figure 4:
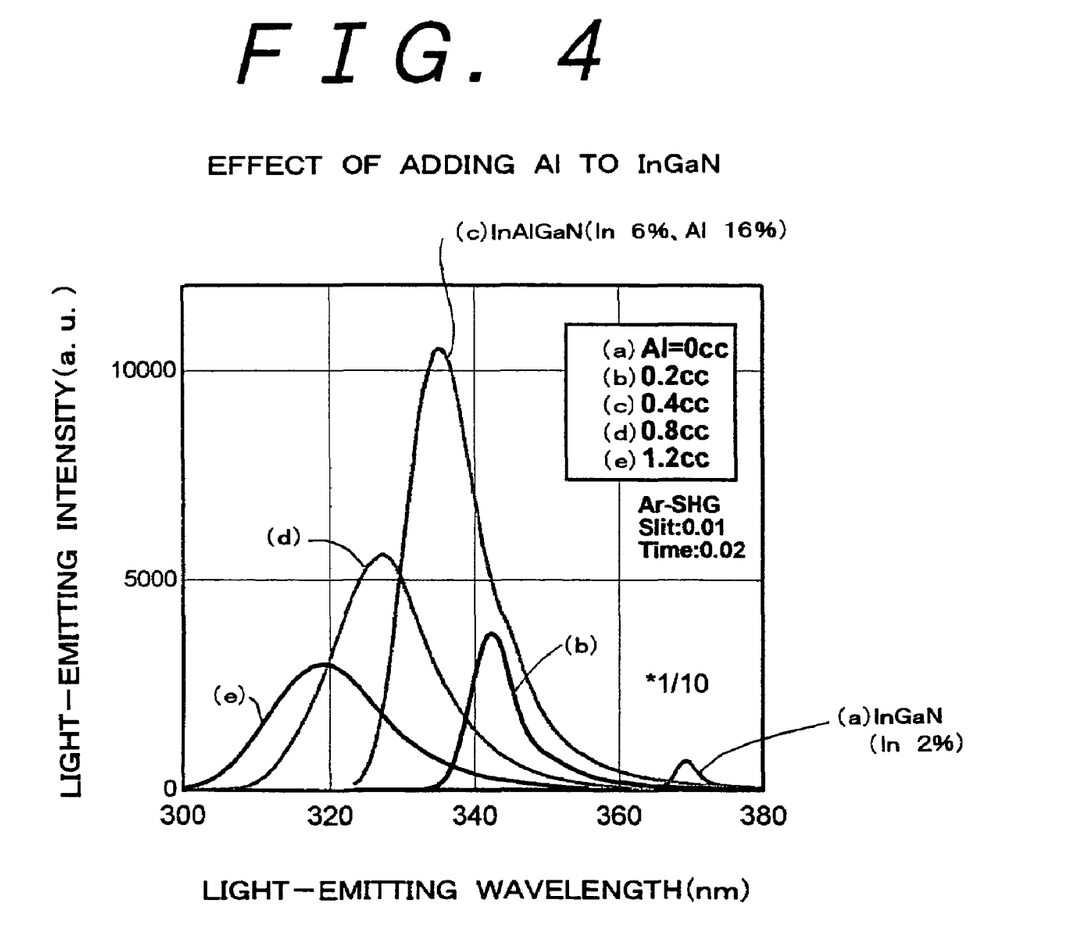
FIG. 4 is a graphical representation indicating effects in introduction of Al into InGaN.

FIG. 4 indicates an effect of introduction of Al into InGaN. As shown in FIG. 4, In is introduced inductively into a crystal as a result of introduction of Al into InGaN. In this connection, the most intensive light emission is achieved in the case when In is 6%, and Al is 16% in a ratio of composition of InGaN.

Figure 5:
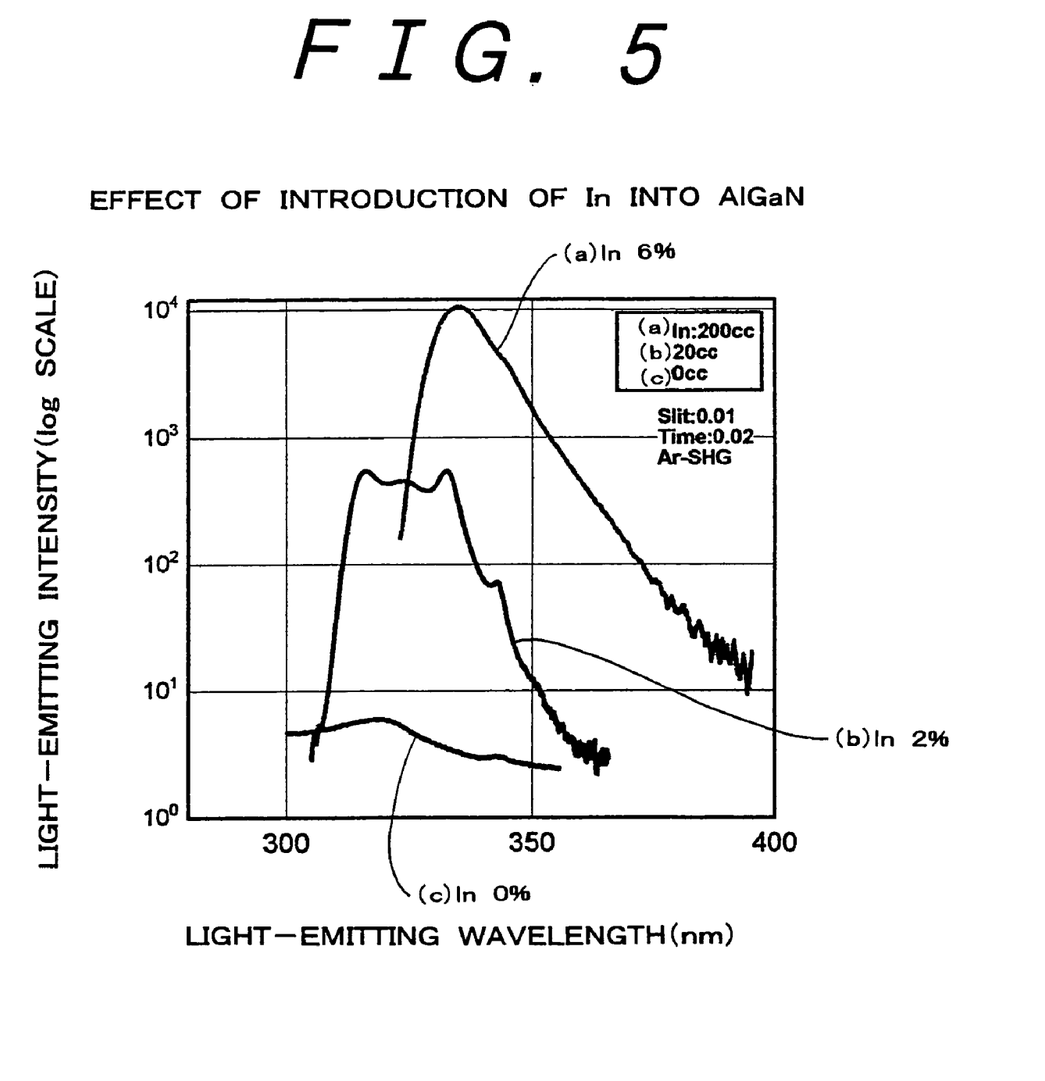
FIG. 5 is a graphical representation indicating effects in introduction of In into AlGaN.

Furthermore, FIG. 5 indicates an effect of introduction of In into AlGaN. Light-emitting intensity increases remarkably with increase of a ratio of introduction of In into AlGaN as shown in FIG. 5.

Figure 6:
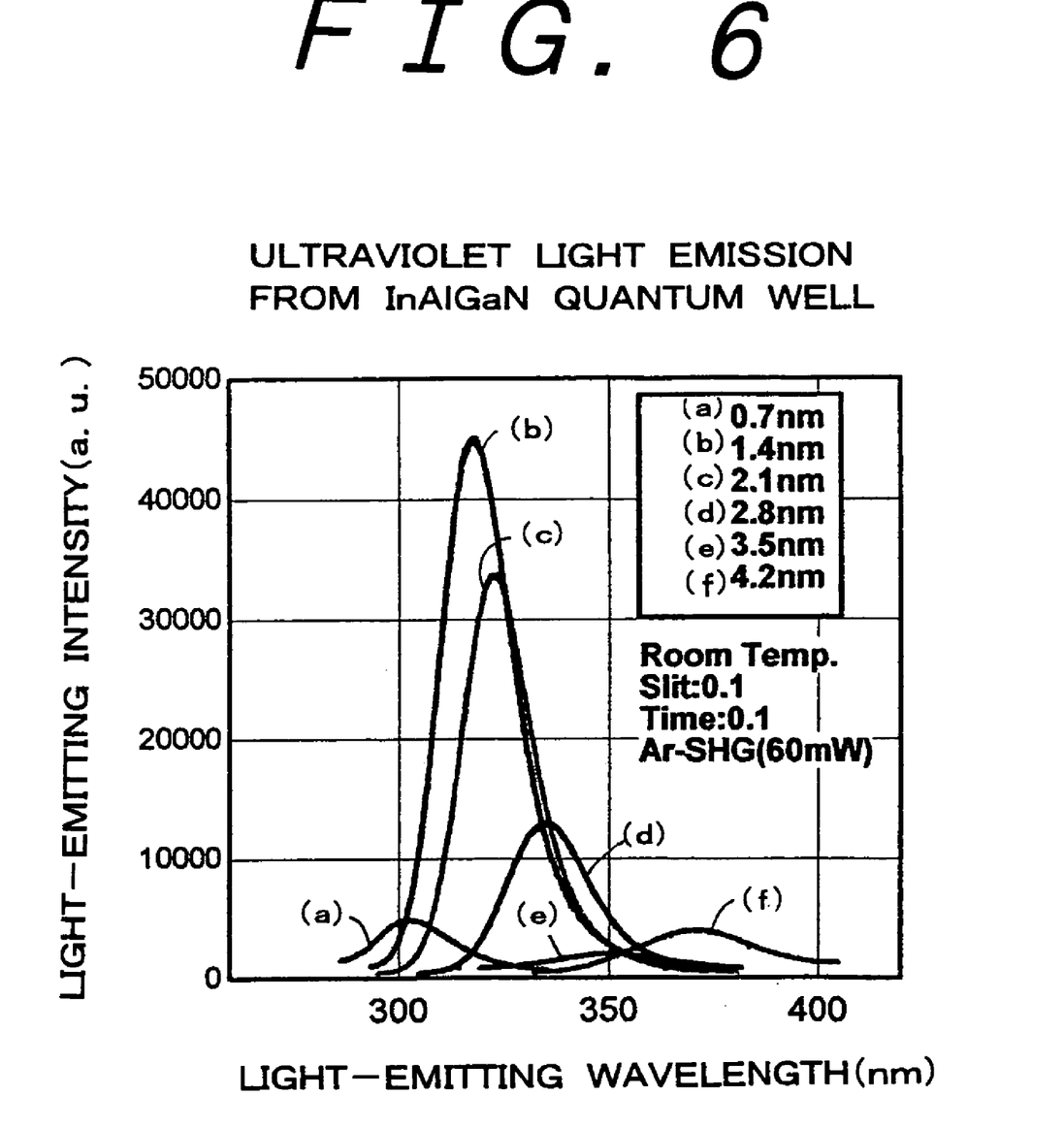
FIG. 6 is a graphical representation indicating ultraviolet light emission from a quantum well of InAlGaN.
Figure 7:
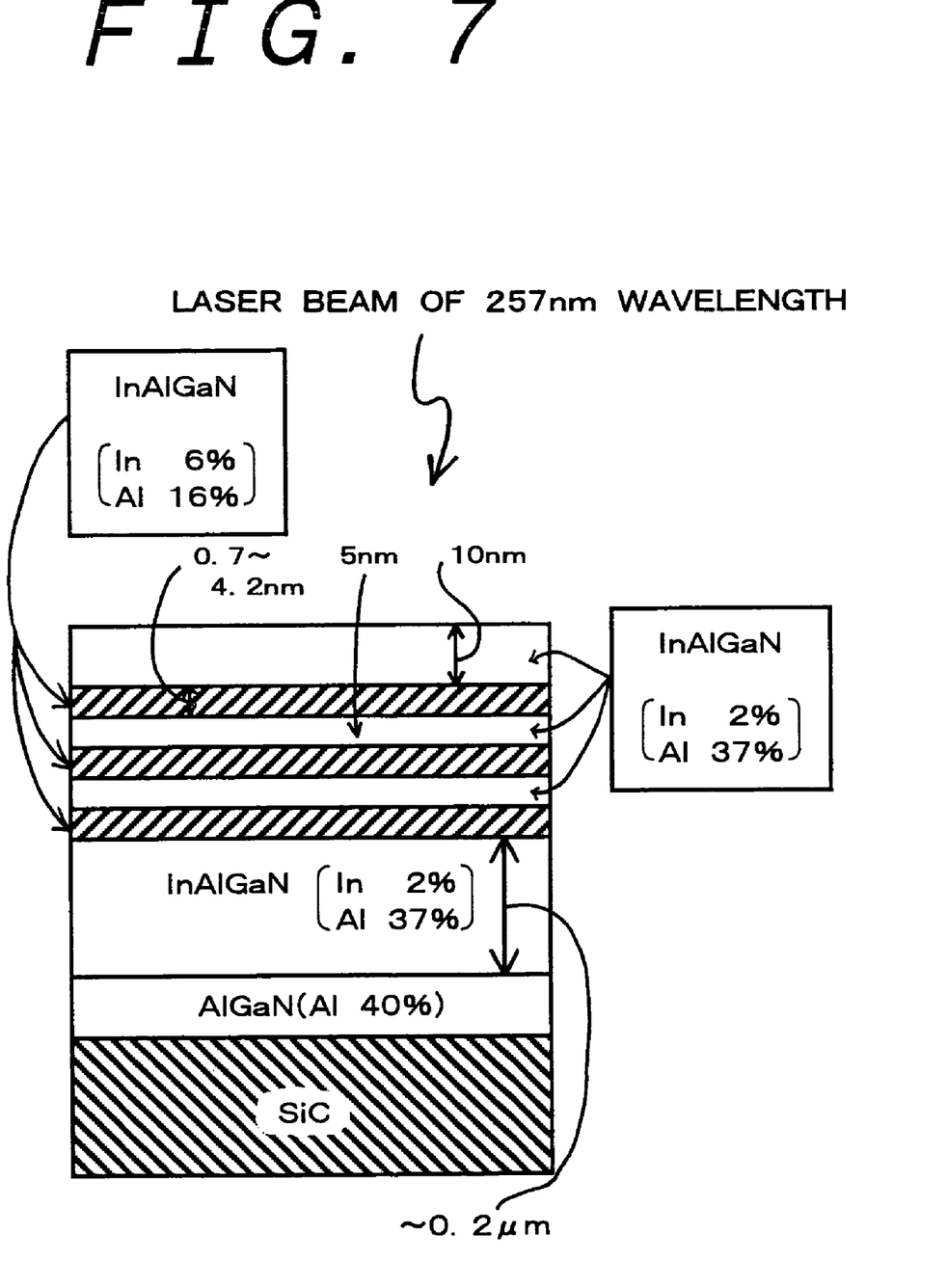
FIG. 7 is an explanatory view illustrating a quantum well structure formed by laminating InAlGaN on SiC through an AlGaN buffer layer.

Moreover, FIG. 6 indicates results of ultraviolet light emission in the case where an InAlGaN layer having a different ratio of composition is laminated on SiC through an AlGaN buffer layer to form a quantum well structure as shown in FIG. 7, and it is irradiated with laser beam of 257 nm wavelength.

As described above, since InAlGaN emits ultraviolet light with a quantum well structure, an ultraviolet light-emitting device such as light-emitting diode, and laser diode provided with a quantum well structure that is prepared by laminating InAlGaN layers having different ratios of composition from one another can be constructed.

More specifically, a quantum well structure may be constructed by such a manner that InAlGaN layers formed on SiC through a buffer layer of AlGaN are doped in the form of p-type or n-type, and they are laminated on one another to form the quantum well structure as shown in FIG. 7, thereafter it is provided with electrodes.

The present invention is constructed as described above, so that it exhibits such an excellent advantage to provide InAlGaN emitting light at room temperature with high efficiency in an ultraviolet short-wavelength region of a wavelength of 360 nm or shorter, and a process for preparing the same as well as an ultraviolet light-emitting device using the InAlGaN emitting light in an ultraviolet short-wavelength region.

It will be appreciated by those of ordinary skill in the art that the present invention can be embodied in other specific forms without departing from the spirit or essential characteristics thereof.

The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

The entire disclosure of Japanese Patent Application No. 2000-45318 filed on Feb. 23, 2000 including specification, claims, drawings and summary are incorporated herein by reference in its entirety.

What is claimed is:

1. An ultraviolet light-emitting device comprising:
   a AlGaN buffer layer being subjected to a crystal growth at a growth temperature of 1000° C. to 1200° C.;
   a first InAlGaN emission layer being subjected to crystal growth at a growth temperature of 830° C. to 950° C. in accordance with metalorganic vapor phase epitaxy wherein ammonia, trimethylgallium, trimethylindium adduct and trimethylaluminum are used as material gases, in said vapor phase epitaxy of said first InAlGaN layer, a content of In in the crystal is proportionate to a content of Al, wherein a ratio of composition of In is 6%, a ratio of composition of Al is 16% and a total of ratios of composition in In, Al and Ga is 100%;
   a second InAlGaN emission layer being subjected to crystal growth at a growth temperature of 830° C. to 950° C. in accordance with metalorganic vapor phase epitaxy wherein ammonia, trimethylgallium, trimethylindium adduct and trimethylaluminum are used as material gases, in said vapor phase epitaxy of said second InAlGaN layer, a content of In in the crystal is proportionate to a content of Al, the ratios of composition of the second InAlGaN layer differ from that of said first InAlGaN layer, wherein a ratio of composition of In is 6%, a ratio of composition of Al is 16% and a total of ratios of composition in In, Al, and Ga is 100%; and
   a quantum well structure formed by laminating alternately a plurality of layers of said first InAlGaN emission layer, and said second InAlGaN emission layer;
   so that the ultraviolet light-emitting device using the InAlGaN emits light having a single peak at room temperature with high efficiency in an ultraviolet short-wavelength region of a wavelength of 280 nm to 360 nm.

2. An ultraviolet light-emitting device comprising:
   a AlGaN buffer layer being subjected to a crystal growth at a growth temperature of 1000° C. to 1200° C.;
   an InAlGaN emission layer being subjected to crystal growth at a growth temperature of 830° to 950° C. in accordance with metalorganic vapor phase epitaxy wherein ammonia, trimethylgallium, trimethylindium adduct, and trimethylaluminum are used as material gases, in said vapor phase epitaxy of said InAlGaN, a content of In in the crystal is proportionate to a content of Al;
   a ratio of composition of In being 6%, a ratio of composition of Al being 16%, and a total of ratios of composition of In, Al, and Ga being 100%;
   the InAlGaN emission layer emitting light having a single peak at room temperature with high efficiency in an ultraviolet short-wavelength region of a wavelength of 280 nm to 360 nm.

3. A process for producing InAlGaN emission layer, wherein,
   a AlGaN buffer layer being subjected to a crystal growth at a growth temperature of 1000° C. to 1200° C.;
   the InAlGaN emission layer is subjected to crystal growth under providing of ammonia, trimethylgallium, trimethylindium adduct, and trimethylaluminum all together and at a growth temperature of 830° to 950° C. in accordance with metalorganic vapor phase epitaxy wherein ammonia, trimethylgallium, trimethylindium adduct, and trimethylaluminum are used as material gases, in said vapor phase epitaxy of said InAlGaN, a content of In in the crystal is proportionate to a content of Al;
   a ratio of composition of In being 6%, a ratio of composition of Al being 16%, and a total of ratios of composition of In, Al, and Ga being 100%;
   the InAlGaN emission layer emitting light having a single peak at room temperature with high efficiency in an ultraviolet short-wavelength region of a wavelength of 280 nm to 360 nm.

4. A process for producing InAlGaN emission layer as claimed in claim 3 wherein a flow quantity of said ammonia being 2 L/min, a flow quantity of said trimethylgallium being 2 µmol/min to 5 µmol/min, a flow quantity of said trimethylindium adduct being 5 µmol/min to 60 µmol/min, and a flow quantity of said trimethylaluminum being 0.5 µmol/min to 10 µmol/min.

* * * * *